US005789272A

United States Patent [19]

Wang et al.

[11] Patent Number: 5,789,272

[45] Date of Patent: Aug. 4, 1998

[54] LOW VOLTAGE FIELD EMISSION DEVICE

[75] Inventors: Wen-Chun Wang; Chi-Hua Wang; Jiun-Tsuen Lai, all of Hsinchu, Taiwan

[73] Assignee: Industrial Technology Research Institute, Hsin-Chu, Taiwan

[21] Appl. No.: 721,671

[22] Filed: Sep. 27, 1996

[51] Int. Cl.$^6$ .......... H01L 21/70; H01L 21/465

[52] U.S. Cl. .......... 438/20; 438/637; 438/679; 438/682

[58] Field of Search .......... 438/637, 639, 438/682, 679, 20, 22, 28; 313/306, 308, 309, 310; 445/24, 50, 51

[56] References Cited

U.S. PATENT DOCUMENTS

| | | | |
|---|---|---|---|
| 5,187,120 | 2/1993 | Wang | 437/192 |
| 5,201,681 | 4/1993 | Okunuki et al. | 445/24 |
| 5,256,588 | 10/1993 | Witek et al. | 438/245 |
| 5,322,809 | 6/1994 | Moslehi | 437/41 |
| 5,461,009 | 10/1995 | Huang et al. | 216/11 |
| 5,468,662 | 11/1995 | Havemann | 437/40 |
| 5,504,038 | 4/1996 | Chien et al. | 437/192 |
| 5,656,525 | 8/1997 | Lin et al. | 216/11 |

*Primary Examiner*—John Niebling
*Assistant Examiner*—Ha Tran Nguyen
*Attorney, Agent, or Firm*—George O. Saile; Stephen B. Ackerman

[57] ABSTRACT

With a view to reducing the gate voltage in Field Emission Devices, three different methods for reducing the diameter of the gate opening in such devices are described. In the first method, metal is deposited on the gate electrode (which is made of polysilicon or amorphous silicon) at an oblique angle of incidence so that the vertical wall of the opening is coated, but not its lower surface. In the second method, all exposed surfaces are coated with metal. For both methods, metal is then removed from all non-polysilicon surfaces through a silicidation step followed by selective etching. In the third method, the gate electrode is selectively coated with a layer of tungsten. In all cases, a uniform reduction of the gate opening is achieved.

22 Claims, 3 Drawing Sheets

*FIG. 1 – Prior Art*

LOW VOLTAGE FIELD EMISSION DEVICE

BACKGROUND OF THE INVENTION (1) Field of the Invention

The invention relates to the field of (cold cathode) Field Emission Devices, more particularly to methods for reducing the magnitude of the gate voltage.

(2) Description of the Prior Art

Cold cathode electron emission devices are based on the phenomenon of high field emission wherein electrons can be emitted into a vacuum from a room temperature source if the local electric field at the surface in question is high enough. The creation of such high local electric fields does not necessarily require the application of very high voltage, provided the emitting surface has a sufficiently small radius of curvature.

The advent of semiconductor integrated circuit technology made possible the development and mass production of arrays of cold cathode emitters of this type. In most cases, cold cathode field emission displays comprise an array of very small conical emitters, each of which is connected to a source of negative voltage via a cathode conductor line or column. Another set of conductive lines (called gate lines) is located a short distance above the cathode lines at an angle (usually 90°) to them, intersecting with them at the locations of the conical emitters or microtips, and connected to a source of positive voltage.

The electrons that are emitted by the cold cathodes accelerate past openings in the gate lines and strike an electroluminescent panel that is located a short distance from the gate lines. Even though the local electric field in the immediate vicinity of a microtip is in excess of 1 million volts/cm., the externally applied voltage can be relatively low. The minimum value of this voltage will depend on how small the microtip-to-gate spacing can be made (reliably) since, for fixed voltage, the field will increase as the spacing is reduced. Additionally, if the voltage is reduced the emitted electrons emerge with lower energies and are therefore easier to focus.

In FIG. 1 we show, in schematic cross-section, the basic elements of a typical cold cathode display. A series of metallic lines 2 is formed on the surface of an insulating substrate 1. Said lines are referred to as cathode columns. At regular intervals along the cathode columns, microtips 5 are formed. These are typically cones of height about one micron and base diameter about one micron. In many embodiments of the prior art, local ballast resistors (not shown here) may be in place between the cones and the cathode columns.

A second series of metallic lines 4 are formed at right angles to the cathode columns, intersecting them at the locations of the microtips. A layer of insulation 3 supports lines 4, which are generally known as gate lines, placing them at the top level of the microtips, that is at the level of the apexes of the cones 5. Openings 11 in the gate lines 4, directly over the microtips, allow streams of electrons 9 to emerge from the tips.

After emerging through the openings 11 in the gate lines, electrons 9 are further accelerated so that they strike fluorescent screen 6 where they emit visible light rays 10. Screen 6 is part of the top assembly which comprises a glass plate 8 on which has been deposited a transparent conducting layer 7. Said top assembly is separated from the cold cathode assembly by spacers (not shown) and the space between these two assemblies is evacuated.

In general, to facilitate the manufacturing process, openings in the gate lines, such as 11 in FIG. 1, end up having diameters comparable to that of the bases of the micro-cones 5. As already discussed, a smaller diameter for these openings would be advantageous because a higher electric field can be generated, resulting in lower turn-on voltages. Typically, about 60 volts is applied between the gate lines and the cathode columns. In the prior art, this corresponds to about 1 micron for openings 11 in FIG. 1.

The present invention is directed towards methods for reducing the size of the gate openings. These methods are modifications of methods that have been used within the semiconductor industry in totally different contexts. For example, Wang (U.S. Pat. No. 5,187,120 February 1993) teaches the selective deposition of tungsten on polysilicon surfaces to form interconnections while Chien et al. teach the formation of metal silicides on selected areas, following which any non-silicides are selectively removed, as a means of making bottom and sidewall contacts. The possibility of using these methods for the reduction of hole size is not anticipated in either invention.

SUMMARY OF THE INVENTION

It has been an object of the present invention to provide a field emission device that operates at a lower gate voltage than those of the current art.

Another object of the present invention is to provide a field emission device wherein the emitted electrons are easier to focus than those of the current art.

Yet another object of the present invention is to achieve the first two objects by providing methods for reducing the diameter of the gate opening in Field Emission Devices.

These objects have been achieved by describing three different methods for reducing the diameter of the gate opening in a Field Emission Device. In the first method, metal is deposited on the gate electrode (which is made of polysilicon) at an oblique angle of incidence so that the vertical wall of the opening is coated, but not its lower surface. In the second method, all exposed surfaces are coated with metal. For both methods, metal is then removed from all non-polysilicon surfaces through a silicidation step followed by selective etching. In the third method, the gate electrode is selectively coated with a layer of tungsten. In all cases, a uniform reduction of the gate opening is achieved.

DESCRIPTION OF THE PREFERRED EMBODIMENTS

Figure 1:
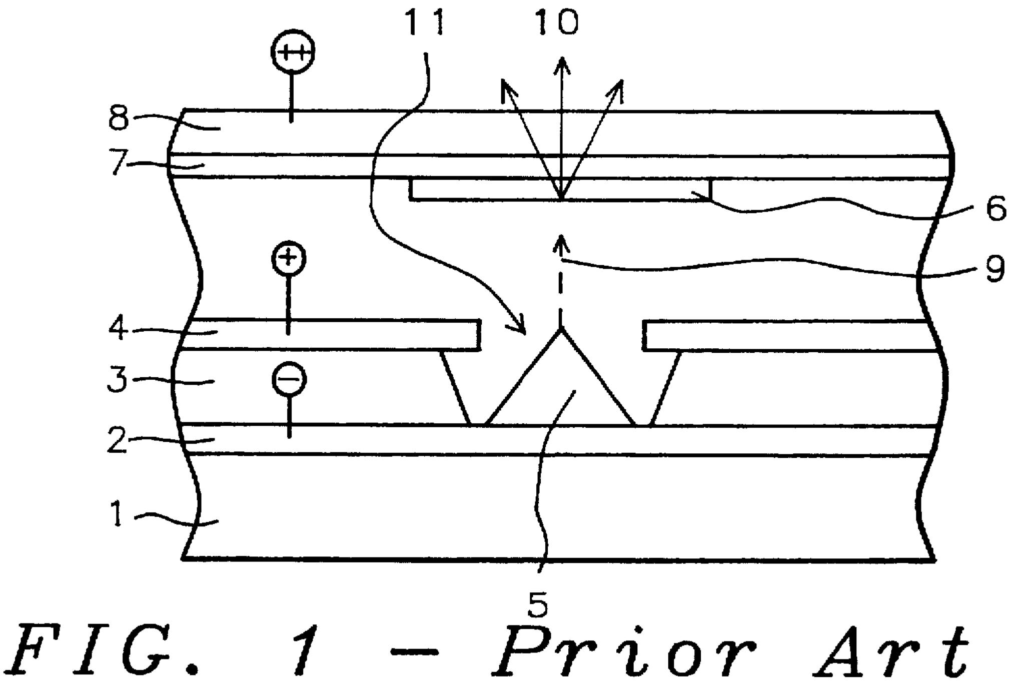
FIG. 1 is a schematic cross-section of a typical Field Emission Device.
Figure 2:
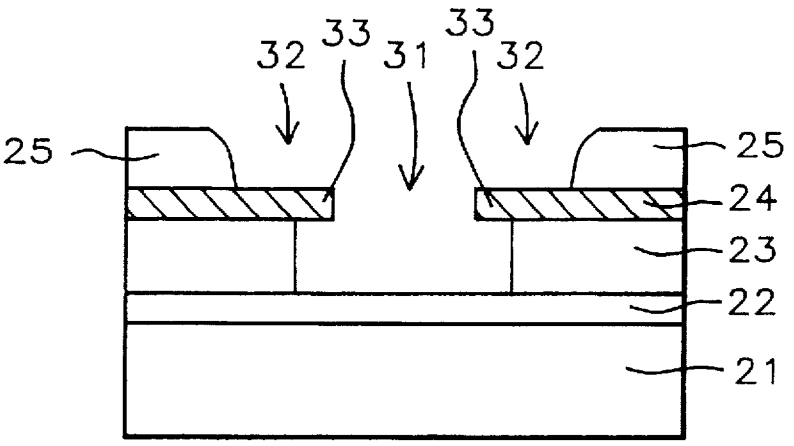
FIG. 2 shows the structure that is the starting point for the method of the present invention.

Referring now to FIG. 2, the method of the present invention begins with the provision of an insulating substrate 21, typically glass or ceramic. Cathode layer 22 is then deposited on substrate 21. The cathode layer will serve to connect the microtip (not shown) to the cathode lines. It is generally made of polysilicon, but does not have to be. For example, it could be made of a resistive material and serve as a ballast resistor.

Next, dielectric layer 23, of a material such as silicon oxide, is deposited on the cathode layer to a thickness in the range of from 0.2 to 2 microns. This is followed by the deposition of a layer of polysilicon or amorphous silicon, between about 0.5 and 0.1 microns thick to form gate layer 24. The last layer is passivation layer 25. It is composed of a material such as silicon oxide and is between about 0.2 and 1 microns thick.

Formation of the gate opening begins by first etching opening 32 in passivation layer 25. This extends as far as gate layer 24. A second, smaller, opening 31 is then etched through the gate and dielectric layers down as far as layer 22. A certain amount of undercutting of the gate layer 24 is allowed to occur. This results in the formation of lip 33 which extends beyond the dielectric layer.

The above sequence of steps results in the structure shown in FIG. 2. In devices made using methods of the prior art the next steps would be those involving the formation of a microtip in the center of cavity 31. The microtip would be a cone with its base resting on layer 22 and its apex level with lip 33. In the present invention, an additional step is introduced, namely that of reducing the size of gate opening 31.

Figure 3:
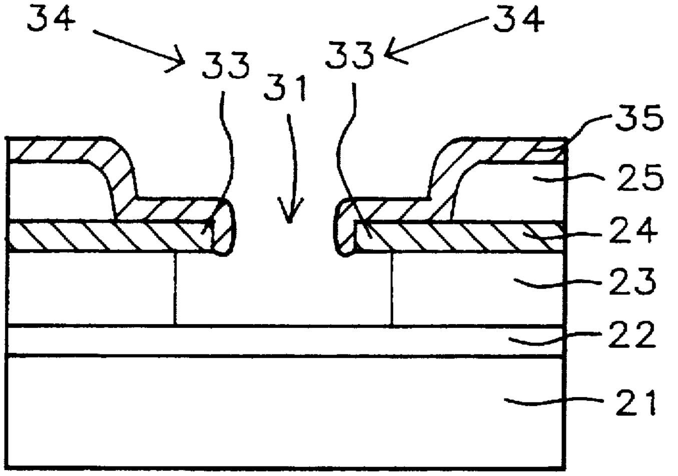
FIGS. 3 and 4 illustrate steps in the process used to narrow the size of the gate opening, in accordance with a first embodiment of the present invention.

Three different embodiments of the invention, whereby the size of the gate opening is reduced, will be described:

The first embodiment is illustrated in FIG. 3. A metal, such as titanium, cobalt, palladium, platinum, or nickel is deposited to form layer 35 which has a thickness between about 500 and 3,000 Angstroms. A key feature of this embodiment is that this metal is caused to arrive at all exposed surfaces at an oblique angle of incidence, as symbolised by the arrows 34. As a result, the vertical inside surface of lip 33 gets coated with the metal, as does the exposed upper surface of gate layer 24, but the lower surface of 24 does not get coated nor does the surface of 22 or the inside walls of opening 31.

Figure 4:
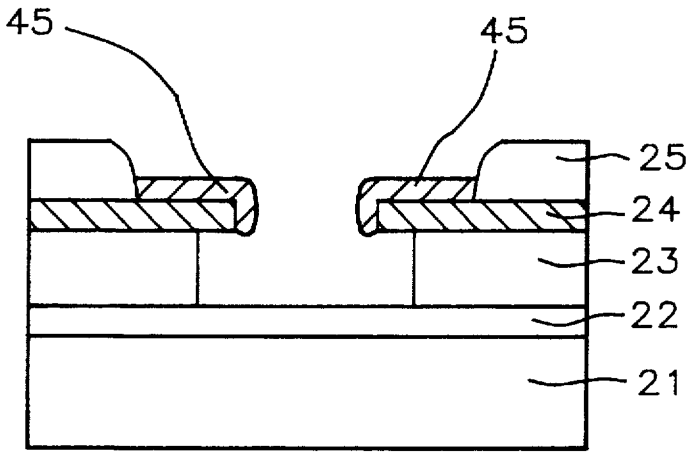

Since layer 35 must not extend beyond layer 24 (otherwise short circuiting to other parts of the circuit is possible) it must be selectively removed from the surface of layer 25. This is accomplished by annealing the entire structure for between about 0.1 and 60 minutes at a temperature between about 400° and 650° C. in an atmosphere of nitrogen or in a vacuum. This causes layer 35 to react with gate layer 24 to form a silicide. By using, for titanium, an etchant such as $NH_4OH/H_2O_2/H_2O$, applied for between 5 and 30 minutes at a temperature between about 25° and 85° C., the unreacted portions of 35 are selectively removed, giving the structure the appearance shown in FIG. 4. If annealing was performed in vacuum, the unreacted material would be the original metal (titanium, cobalt, palladium, platinum, or nickel). If annealing was in nitrogen, the unreacted material would be the nitride of the original metal.

Prior to the procedure of the first embodiment, the diameter of opening 31 in FIG. 2 was between about 0.5 and 1 microns. Following the procedure of the first embodiment it had been reduced to between about 0.2 and 0.7 microns.

The method of the first embodiment includes several different ways to achieve the angular deposition symbolised by the arrows 34 in FIG. 3, all of them based on vacuum evaporation. The first such way is to use a ring source for the evaporated metal. Such a source would encompass the entire substrate so that all material originating from it would arrive at the substrate surface at an oblique angle of incidence.

The second way in which evaporated metal is made to arrive at an oblique angle of incidence is to use an evaporation source that revolves around the substrate. Over a period of time this averages out to a deposition pattern similar to that of the ring source.

The third way is to position the source off to the side of the substrate and to then rotate the substrate while deposition is occurring.

The fourth way is a combination of the second and third ways. Thus the source revolves around the substrate while the substrate is rotating in the opposite direction.

Figure 5:
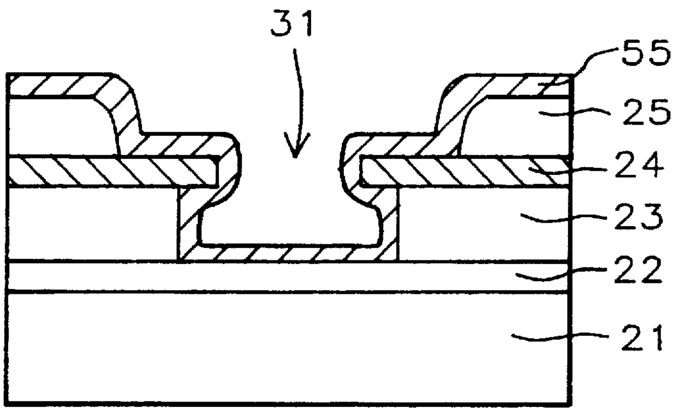
FIGS. 5 and 6 illustrate steps in the process used to narrow the size of the gate opening, in accordance with a second embodiment of the present invention.

In the second embodiment of the invention, the structure shown in FIG. 2 is first formed, as described under the method of the first embodiment. Then, referring to FIG. 5, layer 55 is deposited in conventional manner using sputtering or chemical vapor deposition. This results in the coating of all exposed surfaces, including the walls of opening 31. This latter coating is then selectively removed by annealing the entire structure for between about 0.1 and 60 minutes at a temperature between about 400° and 650° C. in an atmosphere of nitrogen or in a vacuum. This causes layer 55 to react with gate layer 24 to form a silicide. If cathode layer 22 is polysilicon or amorphous silicon, as is often the case in practice, the silicide will generally be formed there as well.

Figure 6:
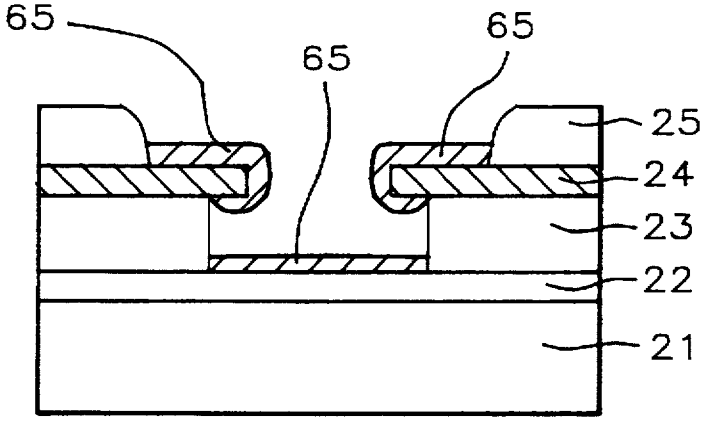

By using an etchant such as $NH_4OH/H_2O_2/H_2O$ for titanium, applied for between 5 and 30 minutes at a temperature between about 25° and 85° C., the unreacted portions of 55 are selectively removed, leaving behind layer 65 and giving the structure the appearance seen in FIG. 6. If annealing was performed in vacuum, the unreacted material would be the original metal (titanium, cobalt, palladium, platinum, or nickel). If annealing was in nitrogen, the unreacted material would be the nitride of the original metal.

Prior to the procedure of the second embodiment, the diameter of opening 31 in FIG. 2 was between about 0.5 and 1 microns. Following the procedure of the second embodiment it had been reduced to between about 0.2 and 0.7 microns.

Figure 7:
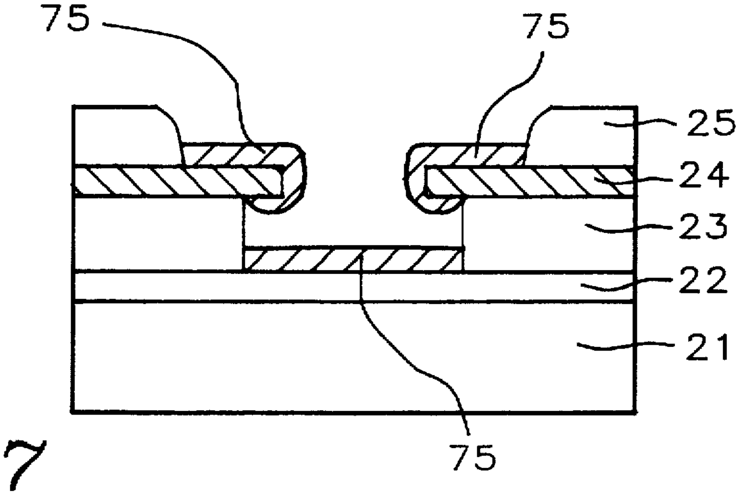
FIG. 7 illustrates the process used to narrow the size of the gate opening, in accordance with a third embodiment of the present invention.

In the third embodiment of the invention, the structure shown in FIG. 2 is first formed, as described under the method of the first embodiment. Then, referring to FIG. 7, metallic layer 75 is selectively deposited on all exposed polysilicon surfaces, to a thickness between about 500 and 2,000 Angstroms. The metal that is selectively deposited is tungsten and the deposition method is chemical vapor deposition. A preferred method for tungsten deposition in this manner is the reduction of tungsten hexafluoride by silane.

Prior to the procedure of the third embodiment, the diameter of opening 31 in FIG. 2 was between about 0.5 and 1 microns. Following the procedure of the third embodiment it had been reduced to between about 0.1 and 0.6 microns.

While the invention has been particularly shown and described with reference to the preferred embodiments thereof, it will be understood by those skilled in the art that various changes in form and details may be made without departing from the spirit and scope of the invention.

What is claimed is:

1. A method for reducing the size of the gate opening in a field emission structure comprising:

providing an insulating substrate;

depositing a cathode layer on said substrate;

depositing a dielectric layer on the cathode layer;

depositing a gate layer, comprising polysilicon or amorphous silicon, on the gate layer;

depositing a passivation layer on the dielectric layer;

etching a first opening in the passivation layer, extending as far as the gate layer;

etching a second opening in the gate and dielectric layers, smaller than said first opening and extending as far as the cathode layer, in a manner whereby undercutting of the gate layer occurs, thereby forming a gate opening with a lip, having upper and lower horizontal surfaces and a vertical surface, that extends beyond the dielectric layer;

further reducing the size of the gate opening by causing evaporated metal to arrive at said lip at an oblique angle of incidence, whereby said lip gets coated on its vertical surface and on its upper horizontal surface to a thickness between about 500 and 3,000 Angstroms;

annealing the structure, thereby causing the evaporated metal to react with the gate layer to form a silicide; and by etching, selectively removing the parts of the evaporated metal that have not formed a silicide.

2. The method of claim 1 wherein causing evaporated metal to arrive at an oblique angle of incidence further comprises using a ring source for said evaporated metal.

3. The method of claim 1 wherein causing evaporated metal to arrive at an oblique angle of incidence further comprises using a source for said evaporated metal that revolves around the substrate.

4. The method of claim 1 wherein causing evaporated metal to arrive at an oblique angle of incidence further comprises using a source, for said evaporated metal, that is located to one side and rotating the substrate.

5. The method of claim 1 wherein causing evaporated metal to arrive at an oblique angle of incidence further comprises using a source for said evaporated metal that revolves around the substrate while the substrate rotates in the opposite direction.

6. The method of claim 1 wherein said evaporated metal comprises titanium or cobalt or palladium or platinum or nickel.

7. The method of claim 1 wherein the step of annealing further comprises heating for between about 0.1 and 60 minutes at a temperature between about 400° and 650° C. in an atmosphere of nitrogen or in a vacuum.

8. The method of claim 1 wherein the step of selectively removing the parts of the evaporated metal that have not formed a silicide comprises, for titanium, etching in $NH_4OH/H_2O_2/H_2O$ for between about 5 and 30 minutes at a temperature between about 25° and 85° C.

9. The method of claim 1 wherein the diameter of the gate opening, prior to the deposition of the metal layer, is between about 0.5 and 1 microns.

10. The method of claim 1 wherein the diameter of the gate opening, after to the deposition of the metal layer, is between about 0.2 and 0.7 microns.

11. A method for reducing the size of the gate opening in a field emission structure comprising:

providing an insulating substrate;

depositing a cathode layer, comprising polysilicon or amorphous silicon, on said substrate;

depositing a dielectric layer on the cathode layer;

depositing a gate layer, comprising polysilicon, on the dielectric layer;

depositing a passivation layer on the gate layer;

etching a first opening in the passivation layer, extending as far as the gate layer;

etching a second opening in the gate and dielectric layers, smaller than said first opening and extending as far as the cathode layer, in a manner whereby undercutting of the gate layer occurs, thereby forming a gate opening with a lip, having upper and lower horizontal surfaces and a vertical surface, that extends beyond the dielectric layer;

further reducing the size of the gate opening by depositing a metal layer on all exposed surfaces to a thickness between about 500 and 3,000 Angstroms;

annealing the structure, thereby causing the deposited metal to react with the gate and cathode layers to form a silicide; and by etching, selectively removing the parts of the deposited metal that have not formed a silicide.

12. The method of claim 11 wherein the metal is deposited by sputtering or by chemical vapor deposition.

13. The method of claim 11 wherein the deposited metal comprises titanium or cobalt or palladium or platinum or nickel.

14. The method of claim 11 wherein the step of annealing further comprises heating for between about 0.1 and 60 minutes at a temperature between about 400° and 650° C. in an atmosphere of nitrogen or in a vacuum.

15. The method of claim 11 wherein the step of selectively removing the parts of the deposited metal that have not formed a silicide comprises, for titanium, etching in $NH_4OH/H_2O_2/H_2O$ for between about 5 and 30 minutes at a temperature between about 25° and 85° C.

16. The method of claim 11 wherein the diameter of the gate opening, prior to the deposition of the metal layer, is between about 0.5 and 1 microns.

17. The method of claim 11 wherein the diameter of the gate opening, after to the deposition of the metal layer, is between about 0.2 and 0.7 microns.

18. A method for reducing the size of the gate opening in a field emission structure comprising:

providing an insulating substrate;

depositing a cathode layer, comprising polysilicon or amorphous silicon, on said substrate;

depositing a dielectric layer on the cathode layer;

depositing a gate layer, comprising polysilicon, on the dielectric layer;

depositing a passivation layer on the gate layer;

etching a first opening in the passivation layer, extending as far as the gate layer;

etching a second opening in the gate and dielectric layers, smaller than said first opening and extending as far as the cathode layer, in a manner whereby undercutting of the gate layer occurs, thereby forming a gate opening with a lip, having upper and lower horizontal surfaces and a vertical surface, that extends beyond the dielectric layer; and further reducing the size of the gate opening by selectively depositing a metal layer on all exposed polysilicon surfaces to a thickness between about 500 and 2,000 Angstroms.

19. The method of claim 18 wherein the metal that is selectively deposited is tungsten and the deposition method is chemical vapor deposition.

20. The method of claim 19 wherein the deposition method further comprises the silane reduction of tungsten hexafluoride.

21. The method of claim 18 wherein the diameter of the gate opening, prior to the deposition of the metal layer, is between about 0.5 and 1 microns.

22. The method of claim 18 wherein the diameter of the gate opening, after to the deposition of the metal layer, is between about 0.1 and 0.6 microns.

* * * * *